(12) United States Patent
Chai

(10) Patent No.: US 9,859,269 B2
(45) Date of Patent: Jan. 2, 2018

(54) ARRAY SUBSTRATE AND METHOD OF PREPARING THE SAME

(71) Applicant: SHENZHEN CHINA STAR OPTOELECTRONICS TECHNOLOGY CO., LTD., Shenzhen (CN)

(72) Inventor: Li Chai, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 14/416,314

(22) PCT Filed: Aug. 20, 2014

(86) PCT No.: PCT/CN2014/084834
§ 371 (c)(1),
(2) Date: Jan. 22, 2015

(87) PCT Pub. No.: WO2016/008197
PCT Pub. Date: Jan. 21, 2016

(65) Prior Publication Data
US 2017/0117265 A1    Apr. 27, 2017

(30) Foreign Application Priority Data
Jul. 17, 2014    (CN) .......................... 2014 1 0342978

(51) Int. Cl.
*H01L 27/02*    (2006.01)
*H01L 27/12*    (2006.01)
(Continued)

(52) U.S. Cl.
CPC ........ *H01L 27/0248* (2013.01); *G02F 1/1368* (2013.01); *G02F 1/13439* (2013.01);
(Continued)

(58) Field of Classification Search
CPC .......................... H01L 27/0248; H01L 27/124
See application file for complete search history.

(56) References Cited

U.S. PATENT DOCUMENTS

| 7,414,697 B1 | 8/2008 | Choi et al. |
| 2005/0007534 A1 | 1/2005 | Kim |
| 2007/0018169 A1 | 1/2007 | Lee et al. |

FOREIGN PATENT DOCUMENTS

| CN | 1892327 A | 1/2007 |
| CN | 101114655 A | 1/2008 |

(Continued)

OTHER PUBLICATIONS

English Translation of CN 1892327 (Translation conducted on May 14, 2017).*

(Continued)

*Primary Examiner* — Amar Movva
(74) *Attorney, Agent, or Firm* — Buchanan Ingersoll & Rooney PC

(57) ABSTRACT

The present disclosure discloses an array substrate and a method of preparing the array substrate. The method comprises providing a substrate having a display area thereon and forming a plurality of pixel structures in said display area. At least one of the plurality of pixel structures is prepared through the following procedures: forming successively, on the substrate, a patterned first metal layer which has a gate line and a floating metal pattern that is insulative to the gate line, a gate insulation layer, and a patterned second metal layer which has a data line, a source, and a drain, wherein the data line is arranged in correspondence with the floating metal pattern and spaced from the floating metal pattern through the gate insulation layer. The array substrate of the present disclosure can increase capacitance for storage of the static electricity generated in a dry plasma (Continued)

bombardment of the second metal layer, thus preventing electrostatic breakdown caused by insufficient capacitive storage.

6 Claims, 3 Drawing Sheets

(51) Int. Cl.
    *G02F 1/1343*     (2006.01)
    *G02F 1/1362*     (2006.01)
    *G02F 1/1333*     (2006.01)
    *G02F 1/1368*     (2006.01)

(52) U.S. Cl.
    CPC .. *G02F 1/133345* (2013.01); *G02F 1/136204* (2013.01); *G02F 1/136286* (2013.01); *H01L 27/124* (2013.01); *H01L 27/1262* (2013.01); *G02F 2201/123* (2013.01)

(56) References Cited

FOREIGN PATENT DOCUMENTS

| | | |
|---|---|---|
| CN | 101211044 A | 7/2008 |
| KR | 20010064400 A | 7/2001 |
| KR | 20070060645 A | 6/2007 |

OTHER PUBLICATIONS

Office Action dated Apr. 29, 2016, by the State Intellectual Property Office of China in corresponding Chinese Patent Application No. 201410342978.6. (6 pages).

International Search Report and Written Opinion (Forms PCT/ISA/220, PCT/ISA/210 and PCT/ISA/237) issued on Apr. 22, 2015, by the State Intellectual Property Office of China in corresponding International Application No. PCT/CN2014/084834. (12 pages).

Office Action with Search Report issued Jan. 5, 2017, by the State Intellectual Property of China in corresponding Chinese Patent Application No. 201410342978.6. (6 pages).

* cited by examiner

ARRAY SUBSTRATE AND METHOD OF PREPARING THE SAME

The present application claims benefit of Chinese patent application CN 201410342978.6 entitled "Array substrate and method of preparing the same" and filed on Jul. 17, 2014, which is incorporated herein by reference.

FIELD OF THE INVENTION

The present disclosure relates to the technical field of liquid crystal displays, in particular to an array substrate and a method of preparing the array substrate.

BACKGROUND OF THE INVENTION

Electro-Static Discharge (ESD) protection has been one of the important issues in the art of preparation of thin film transistor liquid crystal displays (TFT-LCDs). The idea of ESD protection has been generated in the following situations. When a series of process steps (e.g. dry etching) are performed on the surface of a display substrate, quite a few electrostatic charges will accumulate on the substrate, and discharge randomly when this accumulation reaches a certain level. As a result, some pixel structures will be destroyed, thus leading to display defects and even complete damage to the display.

In the prior art, five photomasks are required to form a TFT array substrate. As illustrated in FIG. 1, the substrate is divided into a display area and a periphery area, wherein the display area includes Section I as a TFT and Section II as a storage capacitor. In preparing the array substrate, at the outset, a first metal layer is formed on the substrate and then patterned by means of a first photomask, thus forming a gate 11A in Section I and a bottom electrode (an electrode of the storage capacitor) 11B in Section II. Next, an insulation layer 12 is formed and then patterned by means of a second photomask, so as to form a channel layer 13 and an ohmic contact layer 14 in Section I. Afterwards, a second metal layer is formed and then patterned using a third photomask to form a drain 15, and the ohmic contact layer 14 is partially etched to expose the channel layer 13. A protection layer 17 is subsequently formed on the above structure and then patterned using a fourth photomask, forming a via hole and thus partially exposing the drain 15 of the TFT. Formation and then patterning of a conductive layer then follows by means of a fifth photomask, so as to form a patterned conductive layer 18 as a top electrode of Section II and as a pixel electrode, which is electrically connected to the drain 15 through the via hole. The structure as shown in FIG. 1 is thus formed through the above steps.

It can be known from the above process steps that the gate line and the data line in the array substrate are generally both single metals. Moreover, the data line constitutes the third layer in the entire process but the second layer in formation of the metal layers. In the fourth step, i.e., the step of etching the via hole, a PV layer is first etched away. As a result, the metal layer where the data line is located will be exposed to a dry plasma. While the insulation layer is constantly being etched, the plasma will continuously bombard the metal layer where the data line is located. Therefore, electrostatic charges constantly accumulate on the metal layer, which would easily lead to the phenomenon of ESD, and even electrostatic breakdown in severe situations, thus resulting in scrap of the array substrate.

Consequently, a solution is in urgent need to lower the risk of occurrence of electrostatic breakdown in the process of etching the via hole.

SUMMARY OF THE INVENTION

One of the technical problems to be solved by the present disclosure is to provide a method of preparing an array substrate, with which the risk of occurrence of electrostatic breakdown during preparation can be reduced. The present disclosure further provides an array substrate.

To solve the above technical problem, the present disclosure provides a method of preparing an array substrate, comprising providing a substrate having a display area thereon and forming a plurality of pixel structures in said display area. At least one of the plurality of pixel structures is prepared through the following procedures: forming successively, on the substrate, a patterned first metal layer comprising a gate line and a floating metal pattern that is insulative to the gate line, a gate insulation layer, and a patterned second metal layer comprising a data line, a source, and a drain, wherein the data line is arranged in correspondence with the floating metal pattern via the gate insulation layer; forming a patterned protective layer on the patterned second metal layer, wherein the patterned protective layer comprises a via hole partially exposing the drain; and forming a patterned conductive layer as a pixel electrode on the patterned protective layer, wherein the pixel electrode is electrically connected to the drain through the via hole.

In one embodiment, the floating metal pattern is spaced from and perpendicular to the gate line.

In one embodiment, the floating metal pattern is in the form of a rectangle and the width thereof is smaller than or equal to the width of the data line.

In one embodiment, the floating metal pattern is made of any one selected from a group consisting of tantalum, molybdenum/tantalum, chrome, aluminum, titanium/aluminum/titanium, aluminum/molybdenum, and molybdenum/tungsten.

According to another aspect of the present disclosure, it further provides an array substrate comprising: a substrate having a display area thereon and a plurality of pixel structures formed in said display area. At least one of the plurality of pixel structures includes: a patterned first metal layer which has a gate line and a floating metal pattern that is insulative to the gate line, a gate insulation layer which is arranged on the patterned first metal layer, a patterned second metal layer, which is arranged on the gate insulation layer and comprises a data line, a source, and a drain, wherein the data line is arranged in correspondence with the floating metal pattern via the gate insulation layer; a patterned protective layer, which is arranged on the patterned second metal layer and comprises a via hole partially exposing the drain; and a patterned conductive layer, which is arranged on the patterned protective layer as a pixel electrode, wherein the pixel electrode is electrically connected to the drain through the via hole.

In one embodiment, the floating metal pattern is spaced from and perpendicular to the gate line.

In one embodiment, the floating metal pattern is in the form of a rectangle, and the width thereof is smaller than or equal to the width of the data line.

In one embodiment, the floating metal pattern is made of any one selected from a group consisting of tantalum, molybdenum/tantalum, chrome, aluminum, titanium/aluminum/titanium, aluminum/molybdenum, and molybdenum/tungsten.

Compared with the prior art, one or more embodiments of the present disclosure has the following advantages.

In the array substrate of the embodiment according to the present disclosure, addition of the floating metal pattern below the data line indirectly adds capacitance of the data line, and thus can increase capacitance for storage of static electricity generated in a dry plasma bombardment of the second metal layer. As a result, electrostatic breakdown caused by insufficient capacitive storage can be prevented.

Other features and advantages of the present disclosure will be illustrated and become partially obvious in the following description, or can be understood through implementation of the present disclosure. The purposes and other advantages of the present disclosure will be achievable and obtainable through the structures as indicated in the following description, claims, and drawings.

BRIEF DESCRIPTION OF THE DRAWINGS

The drawings are provided for further understanding of the present disclosure and constitute one part of the description. They serve to explain the present disclosure in conjunction with the embodiments, rather than to limit the present disclosure in any manner. In the drawings.

DETAILED DESCRIPTION OF THE EMBODIMENTS

In order to reveal the purposes, technical solutions, and advantages of the present disclosure more explicitly, the present disclosure will be explained in greater detail in conjunction with the drawings.

Figure 1:
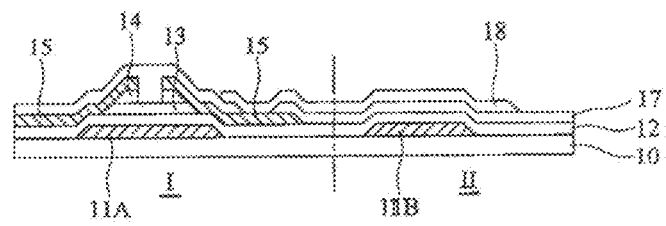
FIG. 1 is a cross-section view of an existing array substrate.
Figure 2:
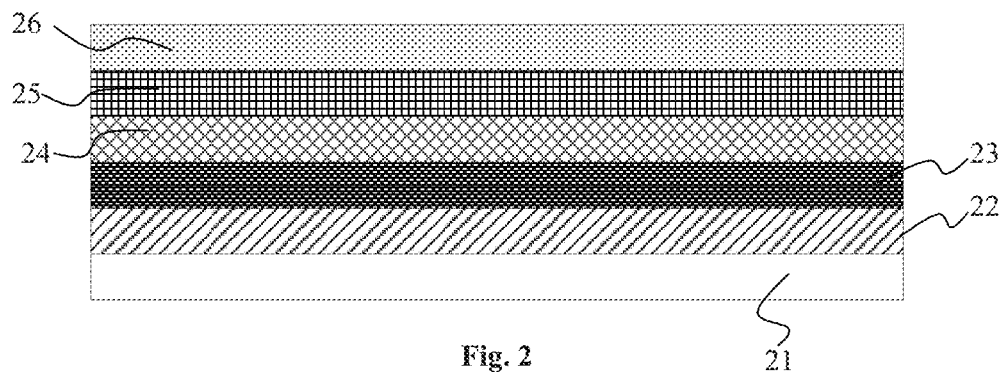
FIG. 2 is a cross-section view of an array substrate according to an embodiment of the present disclosure.

FIG. 2 is a schematic cross-section view of an array substrate according to an embodiment of the present disclosure, roughly showing the structure of the array substrate according to the embodiment of the present disclosure and relations between and among the layers of the array substrate. As shown in FIG. 2, the array substrate of the embodiment of the present disclosure comprises a substrate 21 having a display area thereon, and a plurality of pixel structures formed in the display area. At least one of the plurality of pixel structures includes a patterned first metal layer 22, a gate insulation layer 23 provided on the patterned first metal layer 22, a patterned second metal layer 24 provided on the gate insulation layer 23, a patterned protective layer 25 provided on the patterned second metal layer 24, and a patterned conductive layer 26 provided on the patterned protective layer 25.

Figure 3A:
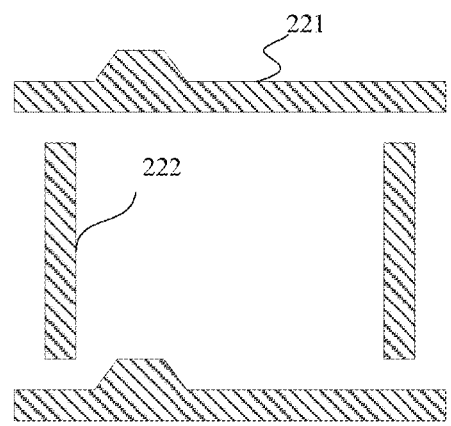
FIGS. 3A to 3C are a series of top views, showing a procedure of preparing an array substrate according to a preferred embodiment of the present disclosure.

FIG. 3A indicates that the patterned first metal layer includes a gate line 221 and a floating metal pattern 222 that is insulative to the gate line 221. And FIG. 3C shows the patterned second metal layer comprises a data line 241, a source 242, and a drain 243, wherein the data line 241 is arranged in correspondence with the floating metal pattern 222 and spaced from the floating metal pattern 222 through the gate insulation layer 23 (see FIG. 5). The patterned protective layer 25 comprises a via hole partially exposing the drain. The patterned conductive layer 26, as a pixel electrode, is electrically connected to the drain 243 through the via hole.

In order to solve the technical problem as stated in the outset of the present disclosure, the floating metal pattern 222 is in particular arranged in the patterned first metal layer 22 according to the embodiment of the present disclosure. The floating metal pattern 222 is arranged on a glass substrate separately, without contact with any other conductive line or conductive element, and is spaced from the data line 241 through the insulation layer 23. Preferably, the floating metal pattern 222 is spaced from and perpendicular to the gate line 221. In addition, the floating metal pattern 222 is not particularly limited in size, and can be designed as actually required. Nevertheless, in order to share the static electricity generated in a dry plasma bombardment in a better way without negatively influencing transmittance, the floating metal pattern 222 can preferably be covered in a complete manner by the data line 241 via the gate insulation layer 23 (see FIG. 5). For example, the floating metal pattern 222 as shown in FIG. 3A is in the form of a rectangular pattern, and has a width smaller than or equal to the width of the data line 241.

The arrangement of the floating metal pattern 222 requires merely addition of a metal pattern in an existing process, and will not affect the existing process. While the floating metal pattern 222 is obtainable through conventional photoetching, etching, or depositing, it can preferably be obtained in the procedure of preparing the gate line, using the same material as the gate line 221. Moreover, the floating metal pattern 222 is preferably made of any one selected from a group consisting of tantalum, molybdenum/tantalum, chrome, aluminum, titanium/aluminum/titanium, aluminum/molybdenum, and molybdenum/tungsten.

Compared with the prior art, addition of the floating metal pattern 222 below the data line 241 indirectly adds capacitance of the data line 241, and thus can increase capacitance for storage of static electricity generated in the dry plasma bombardment of the second metal layer. As a result, electrostatic breakdown caused by insufficient capacitive storage can be prevented. Furthermore, the design of the embodiment of the present disclosure is simple, without complex circuits. The purpose of electrostatic protection can be accomplished only by the floating metal pattern 222, thus saving production costs and reducing complexity of process steps.

Figure 4:
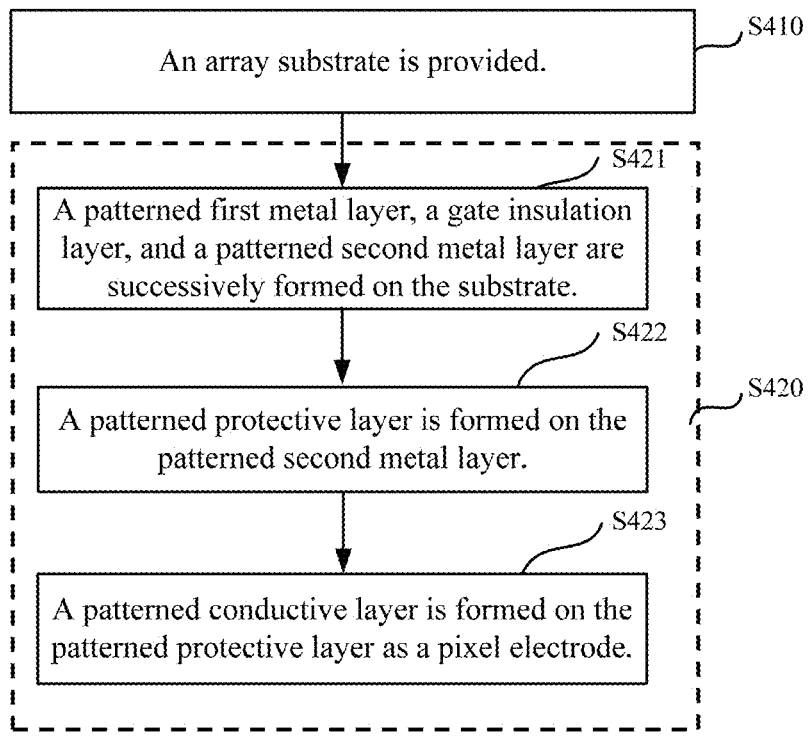
FIG. 4 is a flow chart showing a method of preparing an array substrate according to an embodiment of the present disclosure.

FIG. 4 is a flow chart showing a method of preparing an array substrate according to an embodiment of the present disclosure. As indicated in FIG. 4, the method specifically comprises the following steps.

In step S410, a substrate 21 is provided.

It should be noted that the substrate 21 has a display area and a periphery area, wherein the display area is comprised of a section as a TFT and a section as a storage capacitor. The material for the substrate can generally be a transparent (such as glass, quartz, and the like) or non-transparent (such as wafer, ceramic, and the like) inorganic material, or can also be a flexible material such as plastic, rubber, etc. In this embodiment, the substrate 21 is a glass substrate.

In step S420, a plurality of pixel structures are formed in the display area.

For preparation of one single pixel structure, this step specifically includes the following sub-steps.

In sub-step S421, a patterned first metal layer 22, a gate insulation layer 23, and a patterned second metal layer 24 are successively formed on the substrate 21. The patterned first metal layer 22 includes a gate line 221 and a floating metal pattern 222 that is insulative to the gate line 221. The patterned second metal layer 24 includes a data line 241, a source 242, and a drain 243, wherein the data line 241 is arranged in correspondence with the floating metal pattern 222, and spaced from the floating metal pattern 222 through the gate insulation layer 23.

In the following reference can be made to FIGS. 3A to 3C in order to make this sub-step more explicit.

Figure 3B:
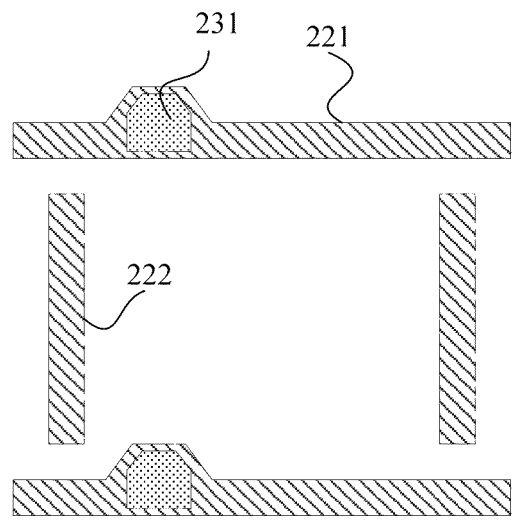
Figure 3C:
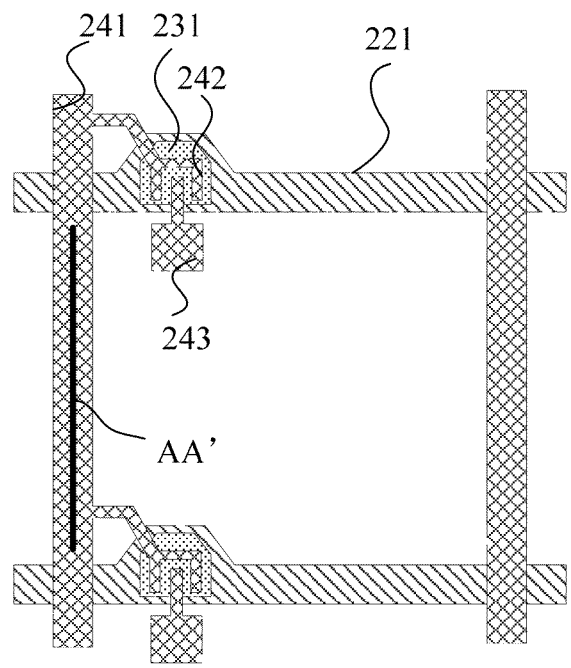

FIGS. 3A to 3C are a series of top views, showing the procedures of preparing an array substrate according to a preferred embodiment of the present disclosure. It should be noted that FIGS. 3A to 3C only demonstrate the first three procedures in forming the TFT of the array substrate.

To start with, a first metal layer is deposited on the entire surface of the glass substrate through a sputtering process, and then patterned through a first photoetching process. The first metal layer can be any one selected from a group consisting of tantalum, molybdenum/tantalum, chrome, aluminum, titanium/aluminum/titanium, aluminum/molybdenum, and molybdenum/tungsten.

The first metal layer pattern is photoetched specifically through the following procedures. The glass substrate evaporated with the metal layer is first washed, and then coated with an ultraviolet-sensitive photoresist, which is pre-baked at a certain temperature for curing. Next, the photoresist is irradiated with ultraviolet through a mask plate placed thereabove, during which, the ultraviolet cannot pass through a portion of the mask plate where there is a pattern, so that a portion of the photoresist that has not been subjected to irradiation will be cured. On the other hand, the ultraviolet will pass through a portion of the mask plate where there is not a pattern, and a portion of the photoresist that has been irradiated will be softened. After that, the photoresist needs to be immersed into a developer to remove the softened portion thereof, which precedes re-baking of the patterned photoresist to solidify the same. Subsequently, an unnecessary portion of the metal layer can be removed by means of treatment in an etchant (wet etching) or in a discharging gas under reduced pressure (dry etching). Finally, the final pattern is obtained after the unnecessary portion of the photoresist is removed by means of wet removal, dry removal, or the like.

Thus, the patterned first metal layer as shown in FIG. 3A is obtained through the above procedures. The patterned first metal layer comprises the floating metal pattern 222 and the gate line 221. Since the floating metal pattern 222 and the gate line 221 are prepared in the same procedure, no other process steps are added despite the addition of the metal pattern.

Subsequently, a gate insulation layer is formed on the structure as obtained above. The gate insulation layer can be made of an organic material such as an organic silicon compound, or an inorganic material such as silicon nitride, silicon oxide, silicon oxynitride, etc. A channel layer and an ohmic contact layer are then formed on the gate insulation layer, in which the channel layer is generally a semiconductive one made of amorphous silicon, polycrystalline silicon, microcrystalline silicon, monocrystalline silicon, or the like. The layers can be formed by chemical vapor deposition (CVD), plasma-enhanced chemical vapor deposition (PECVD), rapid thermal chemical vapor deposition (RTCVD), ultrahigh vacuum chemical vapor deposition (UHV/CVD), or molecular beam epitaxy (MBE). The ohmic contact layer is generally doped silicon, which can be selected as n-doped silicon or p-doped silicon as required. The ohmic contact layer and the channel layer thus formed can be a silicon island 231 as shown in FIG. 3B.

A second metal layer can then be formed by sputtering or other physical vapor deposition, and patterned by the photoetching technique as described above.

The second metal layer can be made of a metal, a composite material, or other materials, and can specifically be any one selected from a group consisting of tantalum, molybdenum/tantalum, chrome, aluminum, titanium/aluminum/titanium, aluminum/molybdenum, and molybdenum/tungsten. Specific photoetching steps will not be repeated here. The patterned second metal layer finally obtained comprises the source 242 and the drain 243 of the TFT, and the data line 241, which is arranged in correspondence with the floating metal pattern 222. The added floating metal pattern 222 does not occupy other spaces on the substrate, and therefore will not lower transmittance of the pixel structure due to space occupation while playing the role of electrostatic protection. As illustrated in FIG. 3C, the above data line 241 is electrically connected to the source 242 of the TFT. The gate line 221, the data line 241, the TFT, etc. have so far been formed on the substrate.

Figure 5:
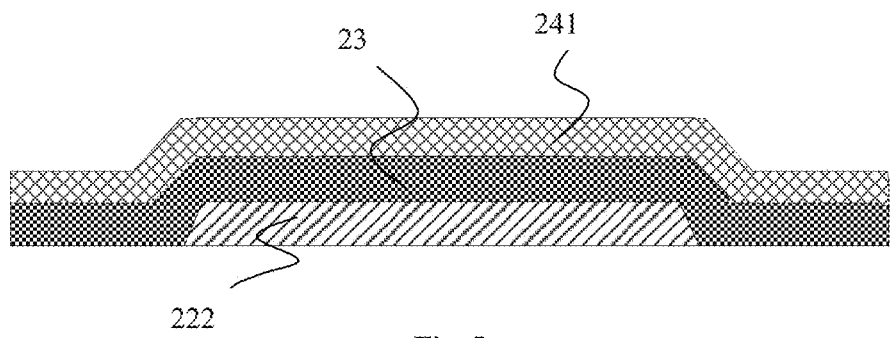
FIG. 5 is a cross-section view taken along line AA' in FIG. 3C.

FIG. 5 is a cross-section view of the array substrate in FIG. 3C along line AA'. As shown in FIG. 5, the data line 241 is arranged in correspondence with the floating metal 222 and spaced therefrom through the insulation layer 23. Compared with the prior art, addition of the floating metal pattern below the data line indirectly increases capacitance of the data line, and thus can increase capacitance for storage of static electricity generated in the dry plasma bombardment of the second metal layer. As a result, electrostatic breakdown caused by insufficient capacitive storage can be prevented. Furthermore, the design of the embodiment of the present disclosure is simple, without complex circuits. The purpose of electrostatic protection, however, can still be accomplished.

In sub-step S422, a patterned protective layer 25 is formed on the patterned second metal layer 24. The patterned protective layer 25 comprises a via hole partially exposing the drain.

Generally, in order to improve electrical connection characteristics between pixel electrodes to be formed in subsequent steps and the metal layer below the via hole, the protective layer needs to be subject to an over-etching treatment in a sufficient manner. Since the floating metal pattern is added below the data line, when the via hole is being etched, the static electricity generated during the dry plasma bombardment of the metal layer where the data line is located can be stored in the floating metal pattern, thus reducing occurrence of the phenomenon of electrostatic breakdown.

In sub-step S423, a patterned conductive layer is formed on the patterned protective layer as a pixel electrode, which is electrically connected to the drain through the via hole formed in sub-step S422.

It should be noted that, according to the present disclosure, the pixel structures are not limited to the aforementioned layout structures. Other layouts or frameworks that employ the principles of the present disclosure and are capable of lowering occurrence of the phenomenon of electrostatic breakdown, such as a pixel structure having a main pixel area and a sub-pixel area, can all be applied to the present disclosure.

What has been discussed above merely constitutes preferred embodiments of the present disclosure rather than to limit the scope of the present disclosure. Any variation or replacement within the technical scope of the present disclosure that would easily occur to one skilled in the art should fall within the scope of the present disclosure.

The invention claimed is:

1. A method of preparing an array substrate, comprising the steps of:
   providing a substrate having a display area thereon; and
   forming a plurality of pixel structures in said display area, wherein at least one of the plurality of pixel structures is prepared through the following procedures:
      forming successively, on the substrate, a patterned first metal layer which has a gate line and a floating metal pattern that is insulative to the gate line, a gate insulation layer, and a patterned second metal layer which has a data line, a source, and a drain, wherein the data line is arranged in correspondence with the floating metal pattern and spaced from the floating metal pattern through the gate insulation layer,
      forming a patterned protective layer on the patterned second metal layer, wherein the patterned protective layer has a via hole partially exposing the drain, and
      forming a patterned conductive layer as a pixel electrode on the patterned protective layer, wherein the pixel electrode is electrically connected to the drain through the via hole,
      wherein the floating metal pattern is in the form of a rectangle, and the width thereof is smaller than or equal to the width of the data line,
      wherein the floating metal pattern is covered in a complete manner by the data line via the gate insulation layer.

2. The method of claim 1, wherein the floating metal pattern is spaced from and perpendicular to the gate line.

3. The method of claim 1, wherein the floating metal pattern is made of any one selected from a group consisting of tantalum, molybdenum/tantalum, chrome, aluminum, titanium/aluminum/titanium, aluminum/molybdenum, and molybdenum/tungsten.

4. An array substrate, comprising:
   a substrate having a display area thereon; and
   a plurality of pixel structures formed in said display area, wherein at least one of the plurality of pixel structures includes:
      a patterned first metal layer which has a gate line and a floating metal pattern that is insulative to the gate line;
      a gate insulation layer which is arranged on the patterned first metal layer;
      a patterned second metal layer, which is arranged on the gate insulation layer and comprises a data line, a source, and a drain, wherein the data line is arranged in correspondence with the floating metal pattern and spaced from the floating metal pattern through the gate insulation layer;
      a patterned protective layer, which is arranged on the patterned second metal layer and comprises a via hole partially exposing the drain; and
      a patterned conductive layer, which is arranged on the patterned protective layer as a pixel electrode, wherein the pixel electrode is electrically connected to the drain through the via hole,
      wherein the floating metal pattern is in the form of a rectangle, and the width thereof is smaller than or equal to the width of the data line,
      wherein the floating metal pattern is covered in a complete manner by the data line via the gate insulation layer.

5. The array substrate of claim 4, wherein the floating metal pattern is spaced from and perpendicular to the gate line.

6. The array substrate of claim 4, wherein the floating metal pattern is made of any one selected from a group consisting of tantalum, molybdenum/tantalum, chrome, aluminum, titanium/aluminum/titanium, aluminum/molybdenum, and molybdenum/tungsten.

* * * * *